United States Patent [19]
Abbott

[11] Patent Number: 5,989,935
[45] Date of Patent: Nov. 23, 1999

[54] COLUMN GRID ARRAY FOR SEMICONDUCTOR PACKAGING AND METHOD

[75] Inventor: Donald C. Abbott, Norton, Mass.

[73] Assignee: Texas Instruments Incorporated, Dallas, Tex.

[21] Appl. No.: 08/961,783

[22] Filed: Oct. 31, 1997

[51] Int. Cl.⁶ .......................... H01L 21/44; H01L 21/48; H01L 21/50
[52] U.S. Cl. ............................................ 438/106; 438/667
[58] Field of Search ..................................... 438/106, 667

[56] References Cited

U.S. PATENT DOCUMENTS

| | | |
|---|---|---|
| 5,260,169 | 11/1993 | Nakano . |
| 5,355,283 | 10/1994 | Marrs et al. ............................ 361/760 |
| 5,822,856 | 10/1998 | Bhatt et al. . |

FOREIGN PATENT DOCUMENTS

| | | |
|---|---|---|
| 0 368 262 | 5/1990 | European Pat. Off. . |
| 0 536 418 | 4/1993 | European Pat. Off. . |
| 0 582 052 | 2/1994 | European Pat. Off. . |
| 0 751 565 | 1/1997 | European Pat. Off. . |
| 3-209841 | 9/1991 | Japan . |
| WO 97 40532 | 10/1997 | WIPO . |

*Primary Examiner*—John F. Niebling
*Assistant Examiner*—Josetta I. Jones
*Attorney, Agent, or Firm*—Mark A. Valetti; W. James Brady; Richard L. Donaldson

[57] ABSTRACT

A method for manufacturing a column grid array semiconductor package (10, 210) may include the steps of providing a substrate material (14, 114, 214) having a first side (16, 116) and a second side (18), forming a plurality of holes (36, 136, 236) in the substrate (14, 114, 214), forming contacts (24, 124,) on the first surface (16, 116) of the substrate (14, 114, 214), filling the plurality of holes (36, 136, 236) with a conductive material (32, 132, 232) to an extent that an extension portion (28, 128, 228) is formed on the second side (18) of the substrate (14, 114, 214) to which an electrical contact may be made. The extension portion (28, 128, 228) may be coated with a capping material (40, 140, 240). The holes (36, 136, 236) may be filled with the conductive material (32, 132, 232) by placing a material (146, 246) over the hole (36, 136, 236) on the first side (16, 116) of the substrate (14, 114, 214) and filling the holes (36, 136, 236) with the conductive material (32, 132, 232). The resist (146, 246) may then be removed.

10 Claims, 2 Drawing Sheets

COLUMN GRID ARRAY FOR SEMICONDUCTOR PACKAGING AND METHOD

TECHNICAL FIELD OF THE INVENTION

This invention relates generally to the field of integrated circuits, and more particularly to grid arrays for semiconductor packaging.

BACKGROUND OF THE INVENTION

Many modern electronic systems incorporate various modular electronic components. For example, personal computers may include modular electronic components in the form of dynamic random access memory units. Each of the modular electronic components may include an integrated circuit fabricated on a semiconductor substrate. Each modular electronic component may be coupled to the electronic system by a series of pins extending in a predetermined sequence from a body of the modular electronic component. The pins may be coupled to leads of a leadframe and external leads or balls may be coupled to the electronic system.

As the density of devices on integrated circuits has continued to increase, the number of leads and traces required for an integrated chip have also increased. At the same time, the size of the integrated circuit chips has in many instances decreased. To help handle the increased density and smaller size, ball grid arrays ("BGA's") were developed.

A ball grid array is a type of package for integrated circuits in which one or more integrated circuit chips are mounted on a top substrate surface, and electrical connection is made to an electrically conductive material, such as the printed circuit board, by an array of small solder balls located on the surface of the substrate opposite from the integrated circuit chip. Traces on the chip side of the substrate may be electrically connected to the solder balls by through-holes which have been electrically plated.

A number of difficulties may be experienced with BGAs because of the different coefficients of thermal expansion of the various components. This and high stresses in some areas have caused some of the solder balls to crack and display other problems. Furthermore, a typical BGA operation requires extreme care in locating and attaching the solder balls to the plating of the through-holes on the side of the substrate opposite the chip. To help alleviate some of the problems with the solder balls cracking and high stress areas, an underfill is sometimes placed around the solder balls and between them. Positioning the underfill around the solder balls, however, presents an extra process step and may involve a difficult operation.

SUMMARY OF THE INVENTION

According to an aspect of the present invention, a column grid array for semiconductor packaging and method are provided that substantially eliminate or reduce disadvantages and problems associated with the previously developed packaging grid arrays. According to an aspect of the present invention, a method of manufacturing a column grid array for semiconductor packaging includes the steps of providing a substrate material, forming a plurality of holes in the substrate, forming contacts on a first surface of the substrate, filling the plurality of holes with a conductive material to an extent that an extension portion is formed on a second side of the substrate to which an electrical contact may be made.

According to another aspect of the present invention, a method of manufacturing a column grid array semiconductor package is provided that includes the steps of providing a substrate material, coating the substrate material on a first side with a first conductive material, forming a plurality of holes through the substrate and first conductive material at locations that correspond to desired package contact points, laminating the first conductive material and the plurality of holes with a resist, exposing the resist to a desired pattern, applying a second conductive material into the plurality of holes to build columns in each hole with an extension portion formed that extends beyond the second side of the substrate, developing the resist, and etching the resist to form the desired contact pattern. According to another aspect of the present invention, the extension portion may be coated with a capping material.

According to another aspect of the present invention, a grid array semiconductor package is provided having a substrate with a first side and a second side and having at least one hole through the substrate, at least one contact on the first side of the substrate for coupling to a semiconductor chip, a conductive material disposed within the at least one hole and electrically coupled to the at least one contact, and a package-contact point formed from the conductive material extending out of the at least one hole beyond a surface of the second side of the substrate.

A technical advantage of the present invention is that the column grid array of the present invention may be manufactured without requiring soldered balls thereby eliminating lead (Pb) in the system. According to another aspect of the present invention, a flexible substrate may be used which allows reel-to-reel processing. According to another aspect of the present invention, an underfill may be conveniently provided during substrate manufacture.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

The preferred embodiment of the present invention and its advantages are best understood by referring to FIGS. 1 through 8 of the drawings, like numerals being used for like and corresponding parts of the various drawings.

Figure 1:
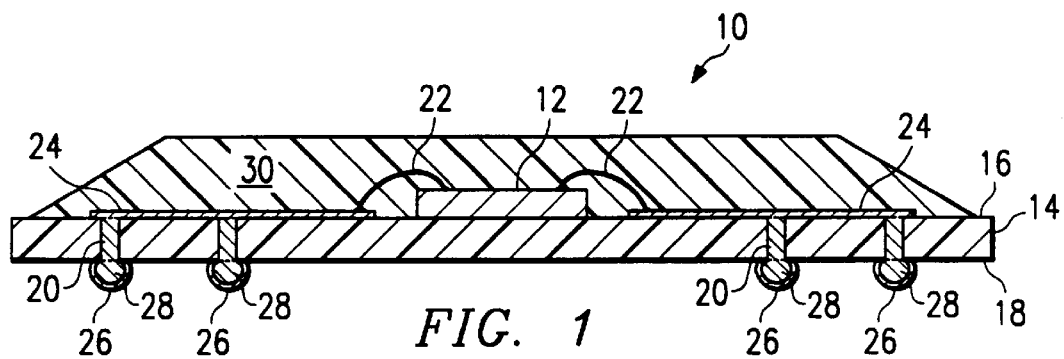
FIG. 1 is a schematic elevational view of a column grid array semiconductor package according to an aspect of the present invention.

FIG. 1 is a schematic cross-sectional view of a column grid array semiconductor package 10 according to an aspect of the present invention. Integrated circuit or semiconductor chip or die 12 is attached with an adhesive to a substrate 14. Substrate 14 has a first side 16 and a second side 18. Substrate 14 may be any of a number of suitable materials. One suitable material for substrate 14 is a flexible polymer which will allow reel-to-reel processing. Substrate 14 may also be a multilayer substrate.

Semiconductor chip 12 may be electrically coupled to a plurality of columns 20 in a number of ways; for example, flip chip mounting may be utilized or traces with a bond pattern may be used. In this embodiment, chip 12 has bonding wires 22 that couple chip 12 to a plurality of traces such as trace 24. Traces 24 are electrically coupled to the plurality of columns 20. Columns 20 are located at predetermined locations according to the desired position of package contacts 26 on the second side 18 of substrate 14. Package contacts 26 may be formed by an extension portion 28 of each column 20. The semiconductor chip 12 and traces 24 may be covered with a molding material or resin 30 to form a completed package.

Figure 2:
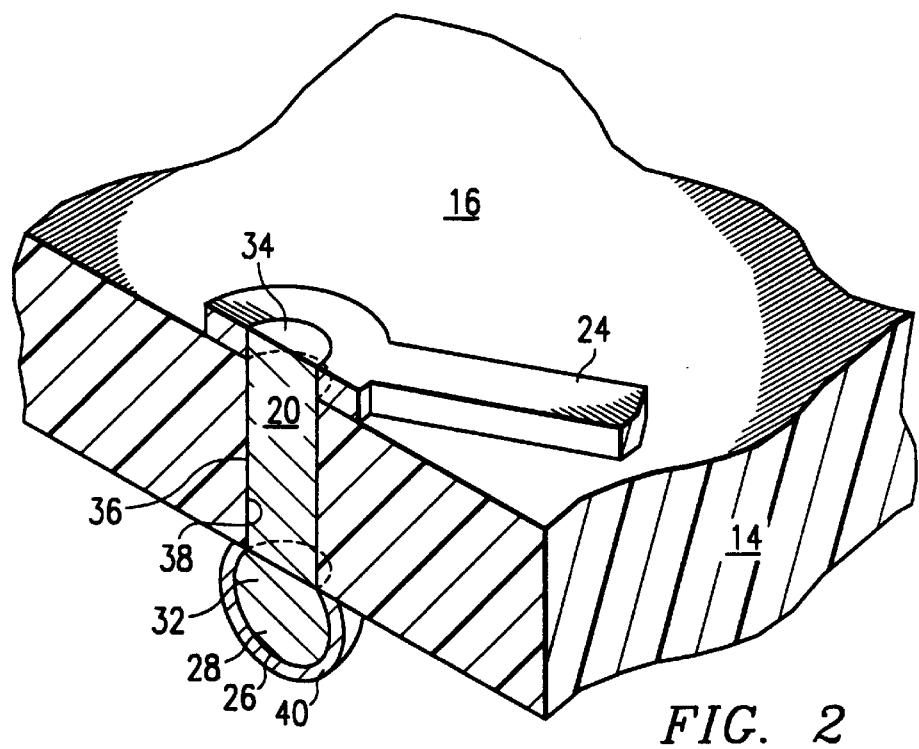
FIG. 2 is a detail of a portion of FIG. 1 in perspective view.

Referring to FIG. 2, a detail of a portion of the column grid array 10 of FIG. 1 is shown. Conductive trace 24 is shown on first side 16 of substrate 14. Column 20, which is formed of a conductive material 32 such as copper or nickel, is electrically coupled to a portion of trace 24 proximate reference numeral 34. Conductive material 32 is applied within a hole 36 formed in substrate 14. The hole 36 is one of the plurality of holes that may be formed on substrate 14 according to the number of desired package contact points 26 (FIG. 1). Holes 36 are formed with interior walls 38 in substrate 14.

The column extension portion 28 may be covered with a capping material 40 such as palladium or palladium/nickel or the like. Capping material 40 may enhance the solderability of package contact point 26.

Figure 3:
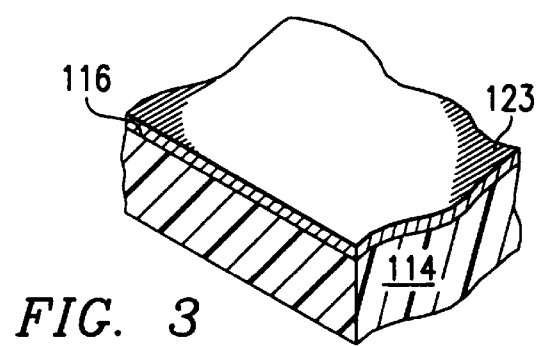
FIGS. 3–7 are schematic diagrams showing steps in manufacturing a column grid array semiconductor package according to an aspect of the present invention.
Figure 5:
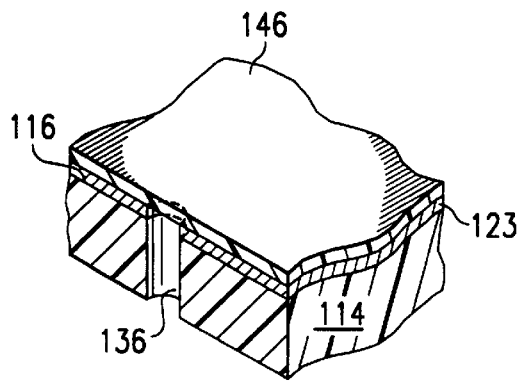
Figure 6:
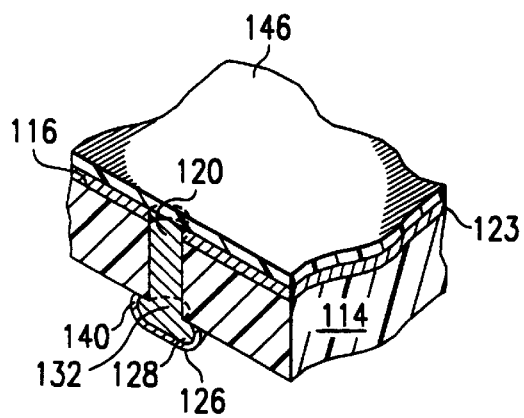
Figure 7:
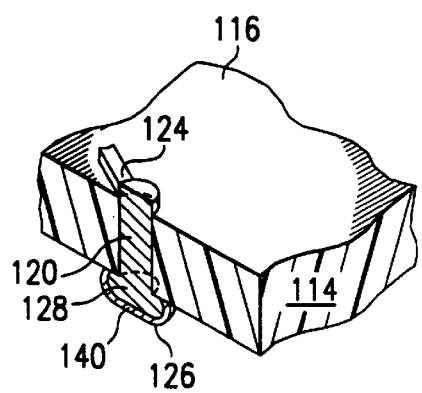

Referring to FIGS. 3–7, a method for manufacturing column grid array 10 is presented. Referring specifically to FIG. 3, a substrate 114, which may be, for example, a flexible polymeric substrate of about 0.010 inches thickness, has a first conductive material 123 applied or coated thereon, which will eventually be used to form a trace or pad 124 (FIG. 7). First conductive material 123 is applied to a first surface 116 of substrate 114. First conductive material 123 may be, for example, a copper layer of approximately 0.002 inches in thickness.

Figure 4:
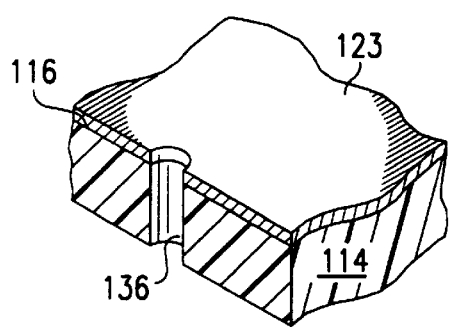

Referring now to FIG. 4, a plurality of holes 136, which only half of one is shown, may be formed in substrate 114. The plurality of holes 136 may be formed by mechanical drilling, laser drilling, etching or chemical milling, or other means. With reference to FIG. 5, a resist 146, e.g. a dry film resist, is laminated over first conductive material 123 and over the opening of hole 136 on the first surface 116 of substrate 114. Resist 146 may be exposed with a pattern to contact the backside of an integrated circuit chip for flip chip mounting or with a trace bond pattern for wire bonding. The first conductive material 123 and substrate 114 may be electroplated with a second conductive material 132 (FIG. 6), such as copper or nickel.

Referring to FIG. 6, second conductive material 132 is applied to fill hole 136 (FIGS. 4–5) completely and to also form an extension portion 128. The resist 146 may be developed and the first conductive material layer 123 etched leaving a pattern for flip chip mounting or trace 124 for wire bonding. Trace 124 is electrically coupled to column 120. Extension portion 128 may be coated with a capping material 140, such as palladium, palladium/nickel or nickel/gold. Traces 124 may also be capped by a capping material, e.g., capping material 140. Capping material 140 provides a thin protective coat to second conductive material 132 and ensures solderability of the resultant package contact point 126. Resist 146 (FIGS. 5–6) is stripped leaving a column grid array as indicated in FIG. 7.

Figure 8:
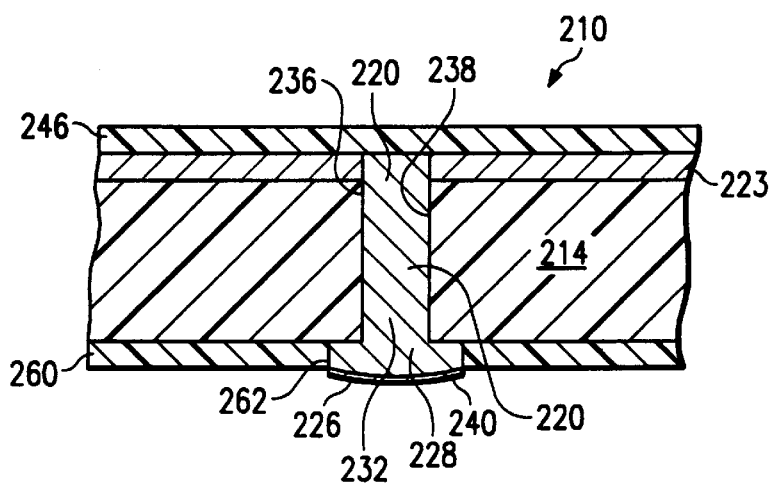
FIG. 8 is a cross-sectional schematic of a column grid array according to an aspect of the present invention.

Referring now to FIG. 8, a column grid array semiconductor package 210 is shown for one specific package contact point 226. In this alternative embodiment, which is substantially formed with steps analogous to the steps presented in connection with FIGS. 3–7, an additional step of applying a material 260 is taken. Material 260 may be an underfill to be left in place or may be a resist to be removed after extension 228 is formed. Material 260 is applied before the column 220 is formed. Material 260 is processed to form a hole 262 adding a diameter larger than first hole 236 through substrate 214. In this manner, when second conductive material 232 is applied, the formed extension portion 228 will have a very controlled shape with all but one surface being molded by either substrate 214 or resist 260 or resist 246 or interior walls 238. As an underfill, material 260 allows the underfill to be applied during the substrate manufacturing process and allows the thickness to be readily controlled to obtain desired thermal attributes.

Although the invention has been particularly shown and described by the foregoing detailed description, it will be understood by those skilled in the art that various other changes in form and detail may be made without departing from the spirit and scope of the invention, which is defined by the appended claims.

What is claimed is:

1. A method of manufacturing a column grid array semiconductor package comprising the steps of:
   providing a substrate material;
   coating the substrate material on a first side with a first conductive material;
   forming a plurality of holes through the substrate and the first conductive material;
   laminating the first conductive material and the plurality holes with a resist;
   exposing the resist to a desired pattern;
   applying a second conductive material into the plurality of holes to build columns in each hole with an extension portion formed that extends beyond the second side of the substrate;
   developing the resist; and
   etching the resist to form the desired contact pattern.

2. The method of claim 1 further comprising the step of coating an exterior portion of the extension portion that extends beyond the second side of the substrate with a capping material.

3. The method of claim 1 wherein the step of coating the substrate material on a first side with a first conductive material comprises the step of coating the first side of the substrate with copper.

4. The method of claim 1 wherein the step of laminating the first conductive material and the plurality holes with a resist comprises the step of laminating the first conductive material and the plurality holes with a dry film resist.

5. The method of claim 1 wherein the step of applying a second conductive material into the plurality of holes to build columns in each hole with an extension portion formed that extends beyond the second side of the substrate comprises the step of applying nickel into the plurality of holes to build columns in each hole with an extension portion formed that extends beyond the second side of the substrate.

6. The method of claim 1 wherein the step of applying a second conductive material comprises the step of applying a conductive material different from the first conductive material.

7. The method of claim 1 wherein the step of applying a second conductive material comprises the steps of:
   electroplating interior walls of each of the plurality of holes and then filling the holes with nickel.

8. The method of claim 1 wherein the step of applying a second conductive material comprises the steps of:

electroplating interior walls of each of the plurality of holes and then filling the holes with copper.

9. The method of claim 1 further comprising the step of coating the extension portion of each column with palladium.

10. The method of claim 1:

wherein the step of providing a substrate material comprises the step of providing a flexible polymeric substrate;

wherein the step of coating the substrate material on a first side with a first conductive material comprises the step of coating the substrate on a first side with copper; and wherein the step of applying a second conductive material into the plurality of holes to build columns in each hole with an extension portion formed that extends beyond the second side of the substrate comprises the step of applying nickel into the plurality of holes to build columns in each hole with an extension portion formed that extends beyond the second side of the substrate.

* * * * *

UNITED STATES PATENT AND TRADEMARK OFFICE
CERTIFICATE OF CORRECTION

PATENT NO. : 5,989,935
DATED : November 23, 1999
INVENTOR(S) : Donald C. Abott

It is certified that error appears in the above-identified patent and that said Letters Patent is hereby corrected as shown below:

Title page, item [60], insert the following:

Related U.S. Application Data
--[60] Provisional Application No. 60/031,379, Nov. 19, 1996--

Column 1, line 2, insert the following:
--CROSS REFERENCE TO RELATED APPLICATION
Reference is made to and priority claimed from U.S. Provisional application Ser. No. U.S 60/031,379, filed Nov. 19, 1996, entitled COLUMN GRID ARRAY FOR SEMICONDUCTOR PACKAGING AND METHOD--

Signed and Sealed this

First Day of August, 2000

*Attest:*

Q. TODD DICKINSON

*Attesting Officer*  *Director of Patents and Trademarks*